/ / United States Patent (10) Patent No.: US 6,541,863 B1
Horstmann et al. (45) Date of Patent: Apr. 1, 2003

(54) SEMICONDUCTOR DEVICE HAVING A REDUCED SIGNAL PROCESSING TIME AND A METHOD OF FABRICATING THE SAME

(75) Inventors: Manfred Horstmann, Dresden (DE); Karsten Wieczorek, Reichenberg-Boxdorf (DE); Gert Burbach, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/475,572

(22) Filed: Jan. 5, 2000

(51) Int. Cl.$^7$ .............................................. H01L 23/48
(52) U.S. Cl. ........................ 257/753; 257/614; 257/635; 257/637; 257/734; 257/743; 257/748; 257/750; 257/752; 257/760; 438/622; 438/624
(58) Field of Search ................................ 257/734, 743, 257/748, 750, 752, 753, 760, 614, 635, 637; 438/622, 624

(56) References Cited

U.S. PATENT DOCUMENTS

| | | | | |
|---|---|---|---|---|
| 4,380,865 A | * | 4/1983 | Frye et al. ..................... 29/576 |
| 4,628,591 A | * | 12/1986 | Zorinsky et al. .............. 29/576 |
| 4,866,009 A | * | 9/1989 | Matsuda ...................... 437/203 |
| 5,103,288 A | * | 4/1992 | Sakamoto et al. ............ 357/71 |
| 5,494,858 A | * | 2/1996 | Gnade et al. ................. 437/231 |
| 5,561,318 A | | 10/1996 | Gnade et al. ................. 257/638 |
| 5,691,238 A | | 11/1997 | Avanzino et al. ............ 437/195 |
| 5,744,865 A | * | 4/1998 | Jeng et al. .................... 257/750 |
| 5,821,621 A | * | 10/1998 | Jeng ............................. 257/759 |
| 5,847,443 A | | 12/1998 | Cho et al. ..................... 257/632 |
| 5,870,076 A | | 2/1999 | Lee et al. ..................... 345/149 |
| 5,904,576 A | * | 5/1999 | Yamaha et al. .............. 438/788 |
| 5,914,183 A | * | 6/1999 | Canham ...................... 428/312.6 |
| 6,017,811 A | * | 1/2000 | Winton et al. ............... 438/597 |
| 6,037,634 A | * | 3/2000 | Akiyama ...................... 257/347 |
| 6,090,724 A | * | 7/2000 | Shelton et al. ............... 438/781 |
| 6,265,303 B1 | * | 7/2001 | Lu et al. ...................... 438/623 |
| 6,287,936 B1 | * | 9/2001 | Perea et al. .................. 438/409 |
| 6,376,859 B1 | * | 4/2002 | Swanson et al. ............. 257/49 |
| 6,407,441 B1 | * | 6/2002 | Yuan ........................... 257/531 |

FOREIGN PATENT DOCUMENTS

| | | | |
|---|---|---|---|
| EP | 0 333 132 | 9/1989 | ........... H01L/23/50 |
| WO | WO 98/00862 | 1/1998 | ......... H01L/21/768 |

OTHER PUBLICATIONS

Poponiak et.al. "High Sheet Resistivity Resistors by the Porous Silicon", Jun. 1975, IBM Tech Disclosure Bulletiin.*

* cited by examiner

Primary Examiner—Eddie Lee
Assistant Examiner—Edgardo Ortiz
(74) Attorney, Agent, or Firm—Williams, Morgan & Amerson, P.C.

(57) ABSTRACT

There is provided a semiconductor device comprising an insulating layer which is partly formed of porous material, and a method for fabricating the device. A stray capacitance of adjacent wiring lines is significantly reduced by reducing the amount of material, i.e., by using porous material in the insulating layer of a metallization layer. In one embodiment, the porous layer may be fabricated separately on a further substrate and is subsequently transferred to the product wafer while the further substrate and the product wafer are appropriately aligned to each other. In this way, fabrication of complete metallization layers having a reduced dielectric constant in advance or concurrently with the product wafer carrying the MOS structure is possible. Due to the reduced capacitance of the wiring lines of the metallization layer, signal performance and/or power consumption of an integrated circuit is improved.

17 Claims, 3 Drawing Sheets

SEMICONDUCTOR DEVICE HAVING A REDUCED SIGNAL PROCESSING TIME AND A METHOD OF FABRICATING THE SAME

BACKGROUND OF THE INVENTION

1. Field of the Invention

The present invention relates to fabricating integrated circuit devices and, more particularly, to the formation of metallization layers exhibiting reduced signal processing time.

2. Description of the Related Art

In the field of semiconductor production, there is a tendency to reduce the dimensions of semiconductor devices in an integrated circuit. At the same time, the clock frequency of a digital circuit, such as a CPU, is routinely increased from one design generation to a subsequent design generation.

As the clock frequency rises, however, the electrical characteristics of the various metallization layers within the integrated circuit steadily gain in importance. High resistivities of the contacts and wiring lines connecting the semiconductor devices, as well as high capacitances resulting from those contacts and lines, increase the fall and rise times of the electrical signals that are transmitted in the integrated circuit, thereby impairing device performance.

In this respect, it is also important to consider the stray capacitances of adjacent contacts and wiring lines. Increased capacitance between adjacent conductors is undesirable because it may delay signal propagation along the conductors, and it may result in increased power consumption by the integrated circuit device, as this capacitance must be charged-up during each operating cycle. As the capacitance of two conductors is inversely proportional to the distance between the conductors, reducing the device dimensions inevitably leads to an increase of the stray capacitance of adjacent conductors. Moreover, in very large scale integration (VLSI) circuits in which multiple metallization layers are formed, the vertical distance between adjacent layers can not be arbitrarily enlarged to reduce the capacitance between these layers, since a maximum vertical distance is determined by the aspect ratio of the via holes connecting two adjacent metallization layers. Exact control of the dimensions of the via holes, however, is necessary to obtain narrowly spaced apart vias for reduced circuit dimensions as well as for a sufficient thickness of the vias to guarantee a low electrical resistivity of the via.

The present invention is directed to a method for solving, or at least reducing the effects of, some or all of the aforementioned problems.

SUMMARY OF THE INVENTION

The present invention is directed to a semiconductor device having reduced signal processing time and a method of making same. In one illustrative embodiment of the present invention, the device is comprised of a layer of porous material having a density ranging from approximately 20–80% of the density from which the porous material is made, and a plurality of conductive interconnections formed in the layer of material.

One illustrative embodiment of the present invention comprises providing a layer of material having an original density, reducing the density of the layer of material to approximately 20–80% of the original density of the starting material, forming at least one opening in the layer with a reduced density, and forming a conductive interconnection in the opening.

BRIEF DESCRIPTION OF THE DRAWINGS

The invention may be understood by reference to the following description taken in conjunction with the accompanying drawings, in which like reference numerals identify like elements, and in which.

Figure 1:
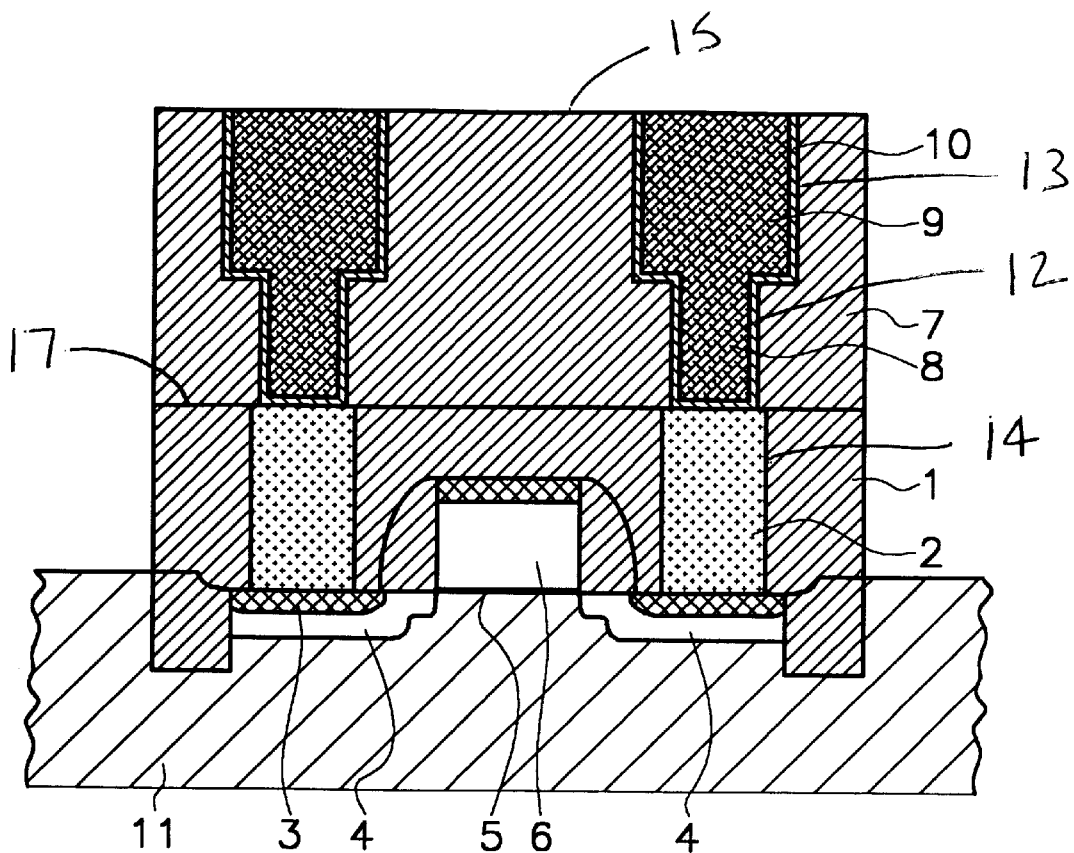
FIG. 1 shows a schematic cross-sectional view of a prior art semiconductor device.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 2A–2E. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those feature sizes on fabricated devices. Nevertheless, the attached drawings are included to describe and explain illustrative examples of the present invention.

In general, the present invention is directed to a semiconductor device having a reduced signal processing time, and a method of making same. As will be readily apparent to those skilled in the art upon a complete reading of the present application, the present invention is applicable to a variety of technologies, e.g., NMOS, PMOS, CMOS, etc., and is readily applicable to a variety of devices, including, but not limited to, logic devices, memory devices, etc.

FIG. 1 shows a schematic cross-sectional view of an illustrative semiconductor device, e.g., a MOS transistor, fabricated on a semiconductor substrate 11 using a typical prior art process. Within an interconnect dielectric material layer 1, local interconnect openings 14 are formed and filled with a metal, such as aluminum, cobalt, tungsten, etc., to form local interconnect metal plugs 2. The local interconnect metal plugs 2 are connected to electrodes 3, which may consist of a metal silicide, for example, cobalt silicide. The electrodes 3 provide electrical contact to underlying active junctions 4 representing source and drain regions of the MOS structure. In addition, a gate oxide 5, usually comprised of silicon dioxide, and a gate electrode 6, usually comprised of polysilicon, are formed over the substrate 11.

A dielectric layer 7 is formed above a planarized surface 17 of the dielectric material layer 1. In one illustrative embodiment, contact openings 12 and wiring openings 13 are formed in the dielectric layer 7 and filled with an electrically conductive material, such as aluminum, tungsten, or copper, to form conductive contacts 8 and conductive lines 9. The dielectric layer 7 and the conductive material in the contact openings 12 and wiring openings 13 may be separated by a barrier layer 10, which may be comprised of a titanium layer and a titanium nitride layer.

In one illustrative embodiment, the openings 12, 13 may be filled with copper using a conventional dual-damascene process. In this process, the dielectric layer 7 is formed on the entire underlying MOS structure using, for example, a CVD (chemical vapor deposition) process. Subsequently, the dielectric layer 7 is patterned by known photolithography and etching processes to generate the contact openings 12 and the wiring openings 13. Due to the different lateral dimensions of the contact openings 12 and the wiring openings 13, the patterning step is performed twice (dual-damascene processing). Next, the barrier layer 10, which may be comprised of two different layers, may be formed. Thereafter, the contact openings 12 and wiring openings 13 are filed with an electrically conductive material such as aluminum, copper, tungsten, etc., to form the conductive contacts 8 and conductive lines 9. In a final step, excess metal and barrier material is polished back to a surface 15 of the dielectric layer 7.

In operation, the electric characteristics of the semiconductor device shown in FIG. 1 are not only determined by the design of the MOS transistor structure, but are strongly affected by the properties of the metallization layer, comprised of the conductive contacts 8 and the conductive lines 9, formed in the dielectric layer 7. In particular, the stray capacitance of the contacts 8 and the lines 9 deteriorate the signal performance in the conventional structure since the fall and rise time of the signals increase with increasing capacitance, and more power is required for charging and discharging the stray capacitance during signal processing.

Figure 2A:
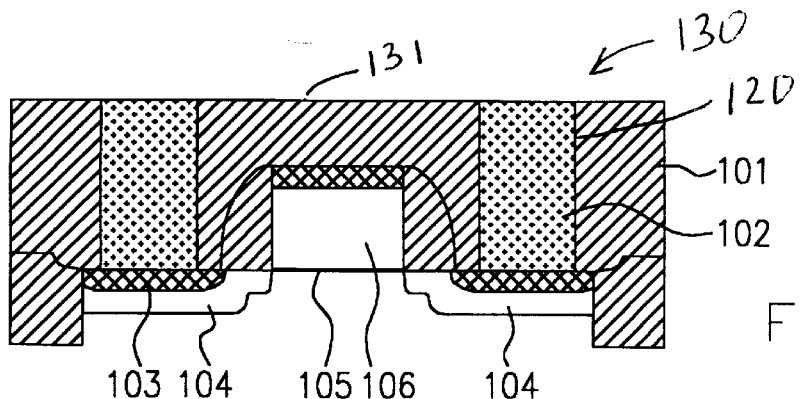
FIGS. 2A–2E show schematic cross-sectional views of a semiconductor device according to one illustrative embodiment of the present invention at successive procedural steps for fabricating the semiconductor device.

FIG. 2A shows a cross-sectional view of a portion of a wafer product 130 according to one illustrative embodiment of the present invention after the local interconnect processing has been completed. Within a first dielectric layer 101, local interconnect openings 120 are formed and filled with local interconnect metal plugs 102. The local interconnect metal plugs 102 are in contact with electrodes 103, which may be made of a metal silicide, e.g., cobalt silicide. The electrodes 103 are in electrical contact with the active junctions 104, which form the drain and source regions of a MOS transistor. A gate electrode 106 is electrically isolated from the active junctions 104 by a gate oxide layer 105.

A typical process for fabricating portions of the MOS structure shown in FIG. 2a will now be described. After the formation of a cobalt silicide layer, by conventional silicide processing, a silicon nitride etch stop layer (not shown) of about 70 nm is formed above the surface of the substrate covering the illustrative transistor. Subsequently, a dielectric stack, which may be comprised of silicon dioxide formed from tetraethoxysilane (TEOS) by an LPCVD or PECVD process, doped or undoped, and possibly comprising an anti-reflecting coating, with a typical thickness of about 700–800 nm, is formed. After the deposition of the dielectric stack and completion of a chemical mechanical polishing step on surface 131 of the dielectric layer 101, a lithography step is carried out wherein optical proximity correction may be employed depending on the feature size. Next, the local interconnect openings 120 are formed by etching the dielectric layer 101, wherein the etching process stops on the etch stop layer (not shown). In a further step, the etch stop layer is removed from the surface defined by the openings 120 by selective etching. After etching and removing the etch stop layer, the photoresist is removed and the wafer is cleaned. A barrier layer (not shown) typically consisting of titanium/titanium nitride is formed in the openings 120 by, for example, a CVD process. The openings 120 are then filled in with a conductive material, such as tungsten, by, for example, a chemical vapor deposition process. In a final step, excess tungsten and the barrier layer on the top surface 131 of the dielectric layer 101 may be removed by a chemical mechanical polishing operation.

Figure 2B:
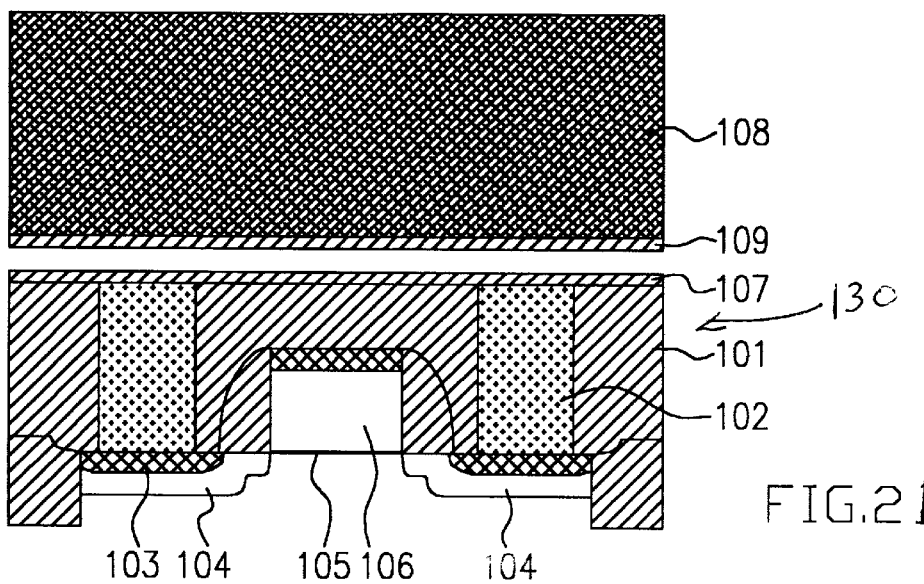

FIG. 2B shows schematically a cross-section of a semiconductor device fabricated according to the principles of one embodiment of the present invention following the local interconnect processing shown in FIG. 2A. In FIG. 2B, like parts to those shown in FIG. 2A are indicated with like reference numerals, and the description of the parts referring to the reference numbers 101–106 is given above and is therefore omitted in all subsequent figures.

In the illustrative structure depicted in FIG. 2B, an adhesion layer 107 is formed above the dielectric layer 101. The adhesion layer 107 may be comprised of a variety of materials, including, but not limited to, silicon dioxide, silicon oxynitride, silicon nitride, etc., and it may have a thickness ranging from approximately 50–1000 Å. Moreover, the adhesion layer 107 may be formed above the dielectric layer 101 by a variety of techniques, e.g., deposition. In one illustrative embodiment, the adhesion layer 107 is comprised of a deposited layer of silicon dioxide having a thickness ranging from approximately 50–1000 Å.

Next, a layer of porous material 108 and an adhesion layer 109 are provided. Ultimately, the porous material layer 108 will be affixed above the dielectric layer 101. In one illustrative embodiment of the present invention, this may be accomplished by bonding the adhesion layer 109 to the adhesion layer 107, although the use of such adhesion layers may not be required. The adhesion layer 109 may be comprised of a variety of materials, including, but not limited to, silicon dioxide, silicon oxynitride, silicon nitride, etc., and it may have a thickness ranging from approximately 50–1000 Å. Moreover, the adhesion layer 109 may be formed on the porous material layer 108 by a variety of techniques, e.g., deposition. In one illustrative embodiment, the adhesion layer 109 is comprised of a deposited layer of silicon dioxide having a thickness ranging from approximately 50–1000 Å.

The porous material layer 108 may be comprised of a variety of materials such as silicon, dielectric oxides, glass, quartz, spherical polymers, fluorinated silicon dioxide, fluorinated TEOS, HSQ, other semiconductors, dielectric compounds of semiconductors such as nitrides, etc. are also appropriate. The porous material layer 108 may have a thickness ranging from approximately 5000–15000 Å. In one illustrative embodiment, the porous material layer 108 is comprised of porous silicon having a thickness ranging from approximately 5000–15000 Å. In this embodiment, the porous material layer 108 and the product wafer 130 with the MOS structure are processed separately.

The porous material layer 108 may be made porous by any of a variety of known techniques, e.g., an annodic reaction process. For example, the porous material layer 108 may be formed by taking an original starting material and reducing the density of the starting material by 20–80%. In the illustrative example where the porous material layer 108 is comprised of silicon, an undoped silicon wafer may be wet-etched with an electrolytic hydrofluoric acid to form the layer 108. To control the wet-etching process, an inert electrode may be attached to one surface of the silicon wafer, and an electric current may be applied while the wafer is exposed to the acid. In the embodiment where the porous material layer 108 is comprised of silicon, the entire undoped silicon wafer may be thinned and concurrently made porous. It is also possible to treat the silicon wafer to obtain a porous layer of required thickness and to perform a deep hydrogen ($H_2$) implantation process to facilitate the separation of the porous layer 108 when transferring it to the product wafer 130.

The degree of porosity of the porous material layer 108 can be controlled by the applied current and process time, as is known by those skilled in the art. The control of the degree of porosity may also be controlled by the intensity of ultraviolet light directed on the wafer while the wafer is being etched by the hydrofluoric acid. In this case the degree of control, however, is not as high as the control effect obtained by variation of the supplied current.

Typically, the porous material layer 108 will be formed so as to reduce the density of the original material used to form the porous material layer 108 by approximately 20–80%. For example, in the illustrative example where silicon, having a density of approximately 2.328 grams per cubic centimeter, is used as the starting material, the porous material layer 108 may be formed so as to have a density ranging from approximately 0.4656–1.8625 grams per cubic centimeter. The electrical resistivity of the porous material layer 108 comprised of silicon is substantially higher than that of solid silicon. That is, the adhesion layer 109 may be blanket-deposited on the porous material layer 108 to facilitate a subsequent low temperature wafer bonding step to be described more fully below.

To achieve improved device performance regarding leakage current, the porous material layer 108 may also need to be passivated by, for example, a low temperature oxidation process. That is, the porous material layer 108 may be subjected to a heating process at a temperature ranging from approximately 800–1100° C. in an oxygen environment. In the illustrative embodiment where the porous material layer 108 is comprised of approximately 5000–15000 Å of silicon, the porous material layer 108 may be subjected to a heating process at a temperature ranging from approximately 800–1100° C. for a duration ranging from approximately 30–180 minutes in an oxygen environment. Through this process, portions, if not all, of the porous material layer 108 comprised of silicon may be converted to silicon dioxide.

Figure 2C:
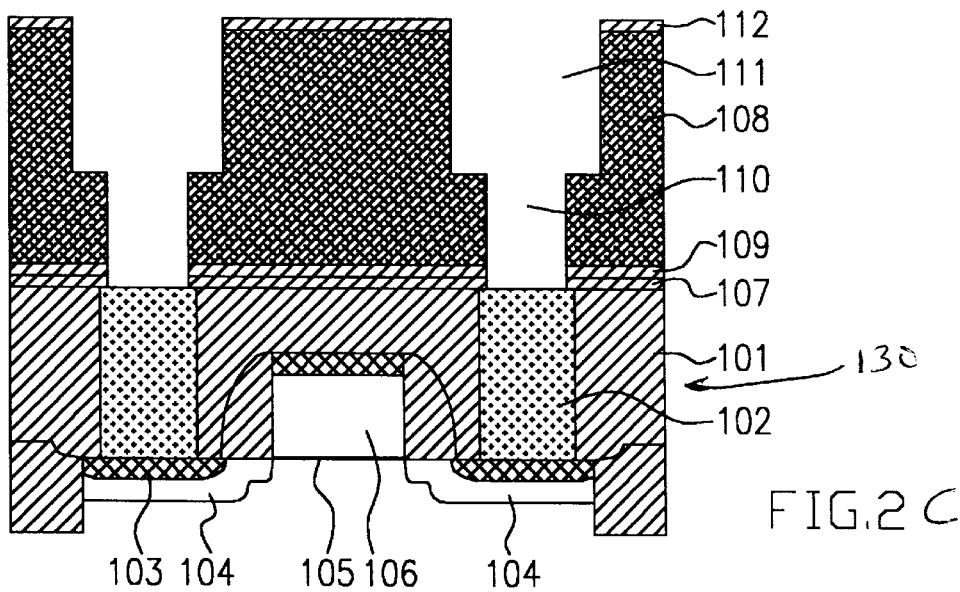
Figure 2:
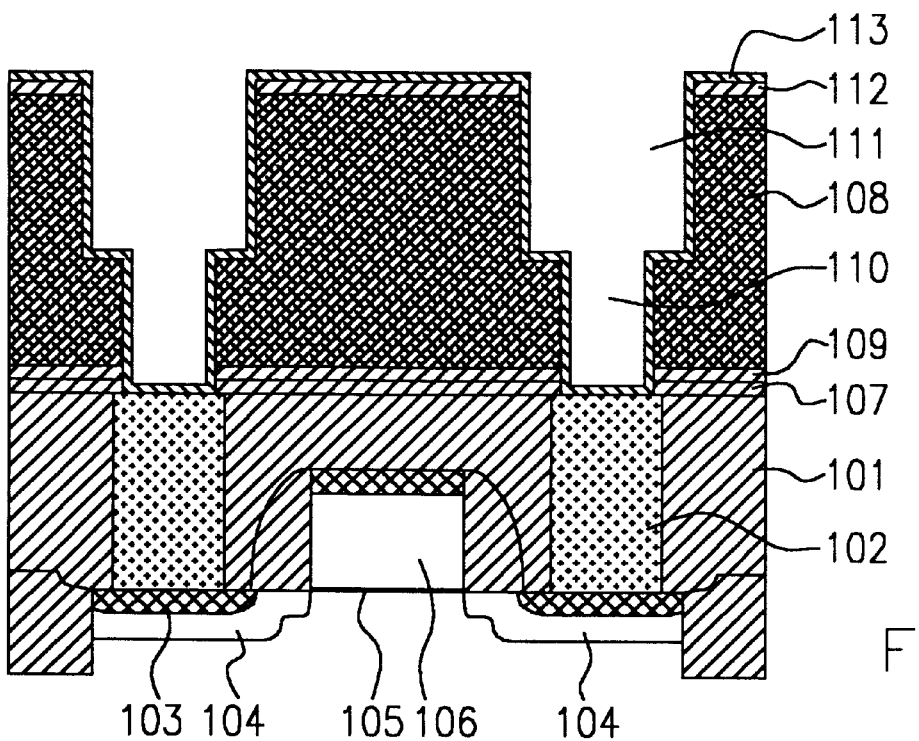
Figure 2:
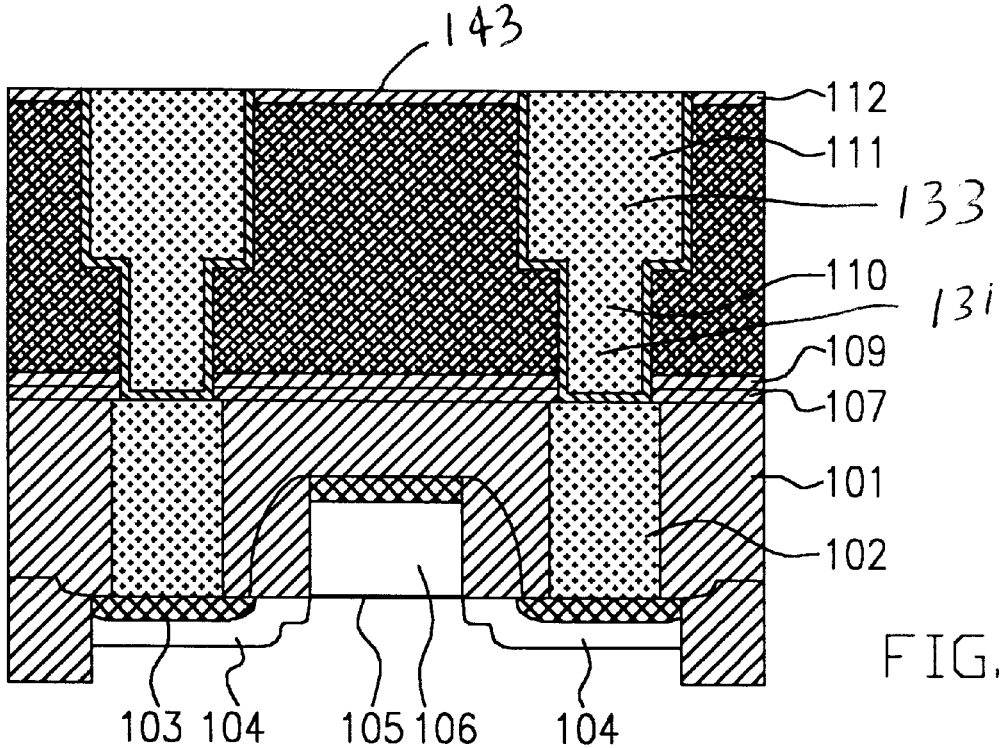

FIG. 2C depicts the semiconductor device after the porous material layer 108 has been joined to the product wafer 130 by low temperature direct wafer bonding, wherein the adhesion layers 107, 109 on the product wafer 130 and the porous material layer 108, respectively, adhere to each other. As shown in FIG. 2C, a plurality of openings 110 may also be formed in the porous material layer 108 by, for example, conventional etching-type processes. The openings 110 may be formed so as to be aligned with the local interconnect metal plugs 102, and they may be formed by any known method. For example, the openings 110, 111 may be formed by dual lithography and etch-processing according to conventional dual-damascene processing. A protective layer 112 may also be formed above the porous material layer 108 prior to the formation of the openings 110, 111. The protective layer 112 may be provided as the porous material layer 108 may be reactive with subsequent processing operations. In one illustrative embodiment, the protective layer 112 is comprised of silicon dioxide having a thickness ranging from 50–1000 Å.

The thickness of the porous material layer 108, and hence the thickness of the first metallization layer, is determined by design and process requirements. The thickness of the porous layer 108 should be large enough to allow the formation of wiring lines having enough volume to accommodate sufficient electrically conductive material to guarantee a desired minimum electrical resistance of the wiring line. On the other hand, the aspect ratio of the contact and wiring line openings 110, 111, and hence the thickness of the porous material layer 108, is restricted by the limitations of the selective etch processing during the dual damascene process. Thus, the vertical distance of adjacent metallization layers cannot arbitrarily be increased to reduce the stray capacitance.

According to one embodiment of the invention described herein, the dual damascene process for forming the contact openings 110 and the wiring line openings 111 is carried out after the porous material layer 108 has been bonded to the product wafer 130. It is also possible, however, to form a metallization layer comprised of, for example, the porous material layer 108, openings 110, 111, and/or layers 107, 109, completely separate from the product wafer 130 and to connect the porous material layer 108 with the product wafer 130 after finishing the formation of the porous material layer 108. Thus, the splitting of the manufacturing process may result in savings on production time since the porous material layer 108 and the product wafer 130 may be produced at the same time.

FIG. 2D depicts a subsequent step in producing a semiconductor device according to one illustrative embodiment of the present invention. A barrier layer 113 may be deposited on the structure as shown in FIG. 2C. Accordingly, the surfaces of the openings 110 and the surfaces of the openings 111 are covered by the barrier layer 113. The barrier layer 113 may be comprised of a metal, a compound or a conductive ceramic, e.g. titanium nitride or tantalum nitride, having a high chemical stability to prevent any chemical reaction of the porous material layer 108 comprised of silicon with the contact metal to be filled in the openings 110, 111.

FIG. 2E is a cross-sectional view of the semiconductor device comprised of an illustrative MOS structure and a porous material layer 108 according to one illustrative embodiment of the present invention. In FIG. 2E, the openings 110, 111 are filled with a conductive material, such as a metal, e.g., copper, aluminum, or tungsten, to form conductive contacts 131, and conductive wiring lines 133. The metal may be deposited by a variety of methods, including a CVD process, plating, a combination of sputtering and subsequent metal-reflow, etc. After the deposition process, excess metal and the barrier layer 113 are polished back to obtain a planar surface 143, thereby achieving separation of the wiring lines 133. The planar surface 143 of the metallization layer may form the basis for subsequent metallization layers.

As already mentioned above, according to one embodiment of the present invention, the porous material layers 108 may be fabricated separately and possibly in advance so that they can be stacked and connected in accordance with the specific design requirements. Furthermore, according to one embodiment of the present invention, a large portion of the entire dielectric material separating the MOS structure and the corresponding contacts 131 and wiring lines 133, i.e., the dielectric layer 101 and the porous material layer 108, consists of material having a low dielectric constant. In this embodiment, the porosity of the porous material layer 108 comprised of, for example, silicon, is adjusted so as to result in a dielectric constant being approximately the same as the dielectric constant of air, i.e., about one, thereby reducing the dielectric constant of the insulating material within the metallization layer compared to a conventional metallization layer by about 50%. For a given spacing distance and thickness of the wiring lines 133, a reduction of the stray capacitance of the wiring lines 133 of about 50% can be achieved, since the capacitance is proportional to the dielectric constant. By reducing the stray capacitance, the overall power consumption of the integrated circuit is also reduced as the current required for charging and discharging the stray capacitance is lower. Moreover, according to the present invention the signal rise and fall times are shorter due to the reduced RC time constant of the metallization layer.

As a result, the present invention provides a semiconductor device in which a portion of the insulating area of the metallization layer exhibits a lower dielectric constant than metallization layers in conventional devices. This may be achieved by providing a porous material layer 108 comprised of materials such as any type of semiconducting material, dielectrics (glass, semiconductor oxides, etc.), which are suitable with respect to their dielectric constant and their properties of process handling. For example, by controlling the degree of porosity of the porous material layer 108, the dielectric constant of the layer can be adjusted close to the dielectric constant of air. Accordingly, the stray capacitance of the metallization layer is reduced, thereby improving the electrical characteristics of the device.

In addition, the present invention provides a method for fabricating a semiconductor device having the features outlined above. According to one illustrative embodiment of the method described herein, the formation of a porous material layer 108 within a metallization layer may be performed separately from the formation of the product wafer 130 on a second substrate. Moreover, the present invention allows the formation of the metallization layer, i.e., the formation of openings for contacts and wiring lines according to standard processing techniques, either on the product wafer 130 after the porous material layer 108 is formed on the product wafer 130, after the porous material layer 108 is transferred to the product wafer 130, or separately formed in the porous material layer 108, which, when completed, is then transferred to the product wafer 130.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor device comprising:
a layer of porous silicon formed from a starting solid silicon material having an original density, said layer of porous silicon having a density of approximately 20–80% of the original density of the starting solid silicon material; and
a plurality of conductive interconnections formed in said layer of porous silicon.

2. The device of claim 1, wherein said layer of porous material is comprised of silicon having a density ranging from approximately 0.4656–1.8625 grams per cubic centimeter.

3. The device of claim 1, wherein said plurality of conductive interconnections are comprised of a plurality of conductive lines.

4. The device of claim 1, wherein said plurality of conductive interconnections are comprised of a plurality of conductive metal plugs.

5. The device of claim 1, wherein said plurality of conductive interconnections are comprised of a plurality of conductive lines and conductive metal plugs.

6. The device of claim 1, further comprising a layer of silicon dioxide bonded to said layer of porous material, said layer of silicon dioxide adapted for bonding to another layer of silicon dioxide on another structure.

7. The device of claim 1, further comprising a layer of silicon dioxide formed above and below said layer of porous silicon.

8. A semiconductor device comprising:
a porous layer of silicon formed from a starting solid silicon material having a density ranging from approximately 0.4656–1.8625 grams per cubic centimeter;
a plurality of conductive interconnections formed in said porous layer of silicon;
a first adhesion layer formed on said porous layer of silicon; and
a second adhesion layer formed on a structure to which said porous layer of silicon is to be affixed above, said first and second adhesion layers being bonded to one another.

9. The device of claim 8, wherein said plurality of conductive interconnections are comprised of a plurality of conductive lines.

10. The device of claim 8, wherein said plurality of conductive interconnections are comprised of a plurality of conductive metal plugs.

11. The device of claim 8, wherein said plurality of conductive interconnections are comprised of a plurality of conductive lines and conductive metal plugs.

12. The device of claim 8, further comprising a layer of silicon dioxide formed above said layer of porous silicon.

13. The device of claim 8, wherein said first adhesion layer is comprised of silicon dioxide, silicon oxynitride, and silicon nitride.

14. The device of claim 8, wherein said second adhesion layer is comprised of silicon dioxide, silicon oxynitride, and silicon nitride.

15. The device of claim 8, wherein said first adhesion layer is comprised of silicon dioxide and said second adhesion layer is comprised of silicon dioxide.

16. The device of claim 8, wherein said structure is comprised of a dielectric layer formed above a semiconducting substrate.

17. The device of claim 8, wherein said structure is comprised of a metallization layer formed on an integrated circuit device.

* * * * *